United States Patent [19]

Kuo

[11] 4,240,092
[45] Dec. 16, 1980

[54] RANDOM ACCESS MEMORY CELL WITH DIFFERENT CAPACITOR AND TRANSISTOR OXIDE THICKNESS

[75] Inventor: Chang-Kiang Kuo, Houston, Tex.

[73] Assignee: Texas Instruments Incorporated, Dallas, Tex.

[21] Appl. No.: 722,841

[22] Filed: Sep. 13, 1976

[51] Int. Cl.³ .................... H01L 27/04; H01L 29/78
[52] U.S. Cl. ...................................... 357/41; 357/23; 357/51; 357/91; 365/149; 365/182
[58] Field of Search ................ 357/23, 41, 24, 51, 357/71, 91, 45; 365/182, 149

[56] References Cited

U.S. PATENT DOCUMENTS

| 3,387,286 | 6/1968 | Dennard | 357/24 |
| 3,874,955 | 4/1975 | Arita | 357/23 X |

OTHER PUBLICATIONS

J. E. Coe et al., "Enter the 16,384-bit RAM", *Electronics*, Feb. 19, 1976, pp. 116–120.
Chiu, "One-Device Memory Cell with Step Oxide Structure", *IBM TDB*, vol. 14, No. 11, Apr. 1972, pp. 3359–3360.
Abbas et al., "Memory Cell Structure", *IBM TDB*, vol. 18, No. 10, Mar. 1976, p. 3288.
Klepner, "One-Device Storage Cell with Implanted Storage Node", *IBM TDB*, vol. 19, No. 2, Jul. 1976.

*Primary Examiner*—James W. Davie
*Attorney, Agent, or Firm*—John G. Graham

[57] ABSTRACT

An N-channel MOS random access memory of the one transistor type is disclosed. The cell utilizes an ion implanted area beneath the capacitor dielectric to permit lower bias voltages on the capacitor. In one example, two levels of polycrystalline silicon are used, one for the bias voltage side of the storage capacitor, and the other for the gate of the MOS transistor and to connect the gate to the bit select line. The capacitor dielectric may be formed of thermal silicon oxide which is about half as thick as the gate insulator of the MOS transistor in the cell. In another example, a single-level poly cell uses an implanted region for the same purpose; the capacitor dielectric is the same thickness as the MOS gate insulator so the lower bias voltage functions to reduce stress failures of the dielectric.

18 Claims, 20 Drawing Figures

RANDOM ACCESS MEMORY CELL WITH DIFFERENT CAPACITOR AND TRANSISTOR OXIDE THICKNESS

BACKGROUND OF THE INVENTION

This invention relates to semiconductor memory devices and methods of manufacture thereof, and more particularly to an N-channel silicon gate MOS RAM cell.

Semiconductor memory cells of the one-transistor type are used in N-channel silicon gate MOS RAM's as described in U.S. Pat. No. 3,909,631, issued Sept. 30, 1975 to N. Kitagawa, and assigned to Texas Instruments Incorporated, and described in *Electronics,* Sept. 13, 1973, p. 116. The most widely manufactured device of this type contains 4096 or $2^{12}$ bits, referred to in the industry as a "4K RAM". The costs in the production of semiconductor devices are such that most of the expense is in bonding, packaging, testing, handling, and the like, rather than the cost of the small chip of silicon which contains the actual circuitry. Thus, any circuit which can be contained within a chip of a given size, for example, 30,000 square mils, will cost about the same as any other. By forming "16K" or 16384 ($2^{14}$) memory cells or bits in a chip, large economies in the cost per bit can result if reasonable yields are obtained. As the size of a chip increases, the yield decreases, so that at sizes above about 210 mils on a side the advantages are outweighed by reduction in yield. Accordingly, it is desirable to reduce the area occupied by each bit or cell in a RAM.

One type of N-channel MOS one-transistor memory cell employing double-level polycrystalline silicon is described in my copending patent application Ser. No. 648,594, filed Jan. 12, 1976, assigned to Texas Instruments. The present invention is an improvement on the cell of my previous application.

One-transistor cells in MOS integrated circuits employ storage capacitors of the type having a silicon oxide dielectric as set forth in U.S. Pat. No. 3,350,760, issued Nov. 7, 1967, to Jack S. Kilby, assigned to Texas Instruments. These may be of the so-called gated type, i.e. voltage dependent, and may have ion implanted regions thereunder as set forth in U.S. Pat. No. 4,059,826, issued to Gerald D. Rogers, assigned to Texas Instruments.

In a dynamic RAM using one-transistor cells, the reliability of the storage capacitor is most critical, since the capacitors constitute a major portion of the total thin oxide area of the chip. Generally, reliability and yield of a device are both inversely related to the area of the chip occupied by their oxide. The capacitor dielectric areas are more critical than the gate areas of the transistors because they are larger and are under a high potential stress at all times. Life test data on N-channel MOS dynamic RAM devices shows that 80 to 90% of reliability related failures are due to oxide defects in the storage capacitors. If the electric field intensity in the storage capacitor dielectric can be reduced, the reliability can be increased. Reliability of a thin silicon oxide dielectric in a capacitor is highly dependent on the electric field intensity in the oxide. Alternatively, by reducing the field intensity, the oxide can be made thinner so that the capacitance per unit area may be increased, allowing a reduction in all area thin oxide area.

The principal object of this invention is to provide an improved random access memory cell of higher reliability, smaller size, and/or higher yield. Another object is to provide an improved method of making N-channel silicon gate RAM devices.

SUMMARY OF THE INVENTION

According to one embodiment of the invention, an improved storage capacitor for an N-channel silicon gate MOS memory cell is provided which uses two levels of polycrystalline silicon. The first level provides the upper plate of the storage capacitors for the cells in a column, and beneath this plate is an ion implanted region which functions to lower the voltage needed to invert this area. This first level is connected to a bias voltage supply which is of lower value than previously used thus lowering the electric field intensity in the capacitor dielectric. The second level polycrystalline silicon provides the gates of the MOS transistors, and also the connection from the gates to an overlying metal strip which is the X address line. The contact area between the metal strip and the second level poly may overlie a part of the first level poly. The implanted area extends beyond the edge of the first level poly, toward the MOS transistor, to assure a low impedance path. In this embodiment, the silicon oxide which forms the capacitor dielectric may be thinner than that which forms the gate insulator of the transistor, so the capacitance is increased.

In another embodiment, a single level poly provides both the transistor gate and the top plate of the capacitor; here the implanted region functions to lower the electric field intensity in the capacitor dielectric and this increases reliability.

THE DRAWINGS

The novel features believed characteristic of the invention are set forth in the appended claims. The invention itself, however, as well as other features and advantages thereof, is best understood from the following detailed description of particular embodiments, when read in conjunction with the accompanying drawings, wherein:

DETAILED DESCRIPTION OF SPECIFIC EMBODIMENT

Figure 1:
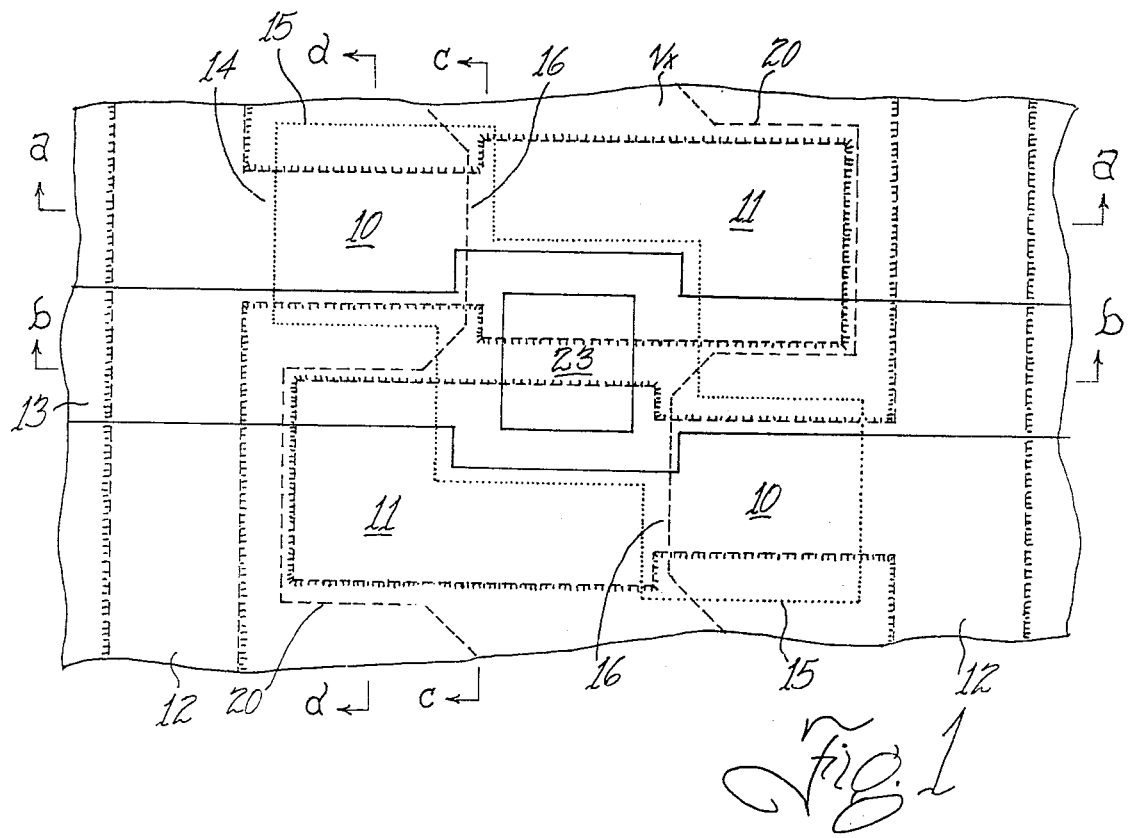
FIG. 1 is a greatly enlarged plan view of a very small area on a semiconductor chip, showing two random access memory cells made according to the invention.
Figure 2:
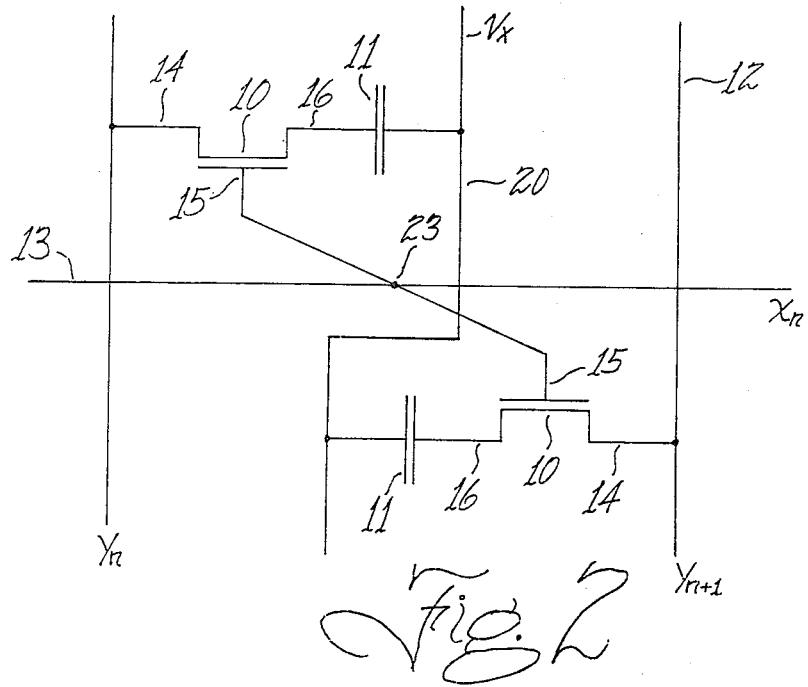
FIG. 2 is an electrical schematic diagram of the cells of FIG. 1.

Referring to FIG. 1, MOS RAM cells according to the invention are illustrated in physical layout. Each cell includes an MOS access transistor 10 and a storage capacitor 11, as also seem in the electrical schematic diagram of FIG. 2. Sense lines 12 are provided by N+ diffused regions; these lines are the Y lines which connect to a large number of the cells in a column. For example, there may be sixty-four cells in one-half of a column, each having a transistor 10 and a capacitor 11 connected to a sense line 12. A sense amplifier of the type shown in U.S. patent application Ser. No. 691,734, filed June 1, 1976 now abandoned, refiled June 30, 1978 as Ser. No. 920,756, now abandoned, by White and Kitagawa, assigned to Texas Instruments, would be included at the center of each column or sense line. A metal strip is the X address or row select line 13, and this line is connected to all the gates of all transistors in a row, for example one hundred twenty-eight in a 16K RAM. The area occupied by the two cells of FIG. 1 is now more than about one mil squared, or one-half square mil per cell.

Figure 3A:
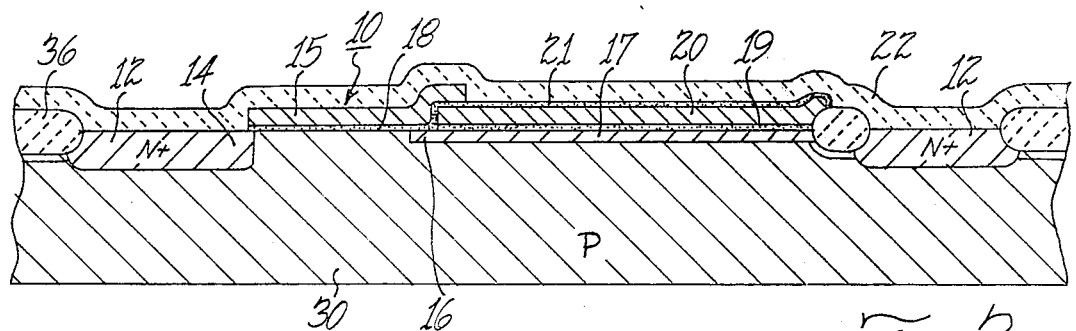
FIGS. 3a, 3b, 3c and 3d are sectional views of the device of FIG. 1, taken along the lines a—a, b—b, c—c and d—d of FIG. 1, respectively.
Figure 3B:
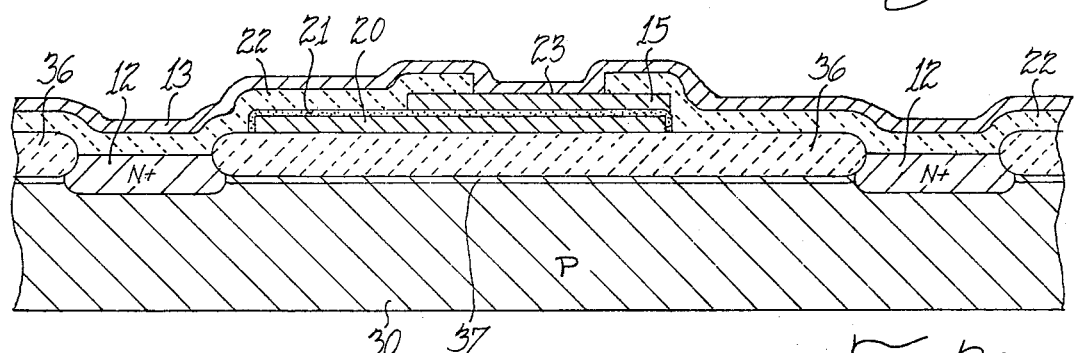
Figure 3C:
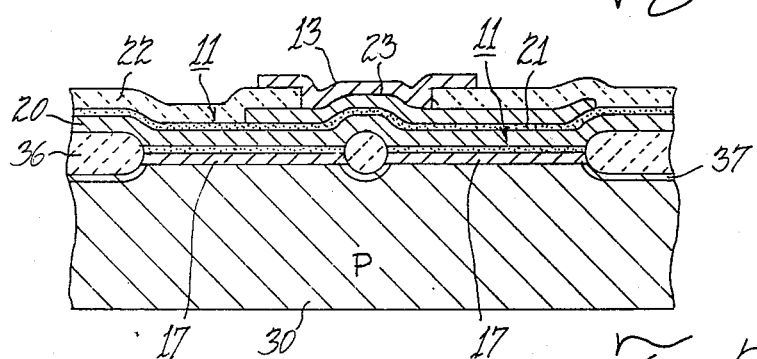
Figure 3D:
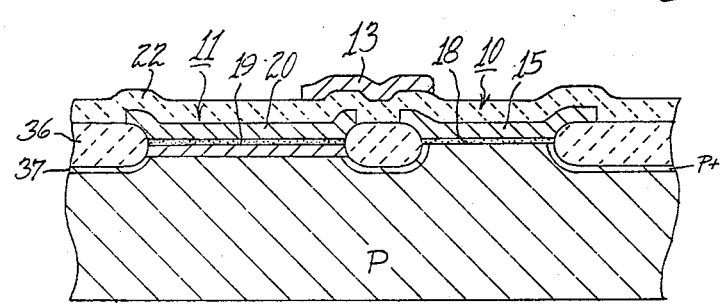

As best seen in FIGS. 3a-3d, along with FIG. 1, each MOS transistor 10 includes an N+ diffused region 14 which forms the source (or drain). The N+ region 14 is part of the sense line 12 which is an elongated continuous diffused N+ region. Further, the transistor 10 includes a gate 15 created by the second-level polycrystalline silicon, as will be explained. The drain 16 of the MOS transistor is created by the edge of an implanted inversion region 17 beneath the capacitor 11. The implanted region 17 provides a primary feature of the invention in that the voltage needed to invert this region is much less than previously required. A thin silicon oxide layer 18 functions as the gate insulator for the MOS transistor 10, and a separate thin oxide layer 19 provides the dielectric of the capacitor 11. According to one feature of the invention, the oxide layers 18 and 19 may be of different thicknesses. The upper plate for the capacitor 11 is provided by the first-level polycrystalline silicon which is an elongated strip 20 connected to a supply voltage Vx which may be about one-half Vdd, according to one aspect of the invention. It is important that the implant region 17 extends beyond the edge of the first level poly 20 to avoid a high resistance gap at the location 16; this will be understood when the method for making is explained. A layer 21 of silicon oxide separates the first and second levels of polysilicon 20 and 15, and a thick layer 22 of silicon oxide covers both layers of polysilicon as well as the entire chip. As seen in FIG. 3b, a metal strip which forms the row address line 13 overlies the layer 22 and extends down to make contact with the second level poly 15 at a contact location 23.

Figure 4A:
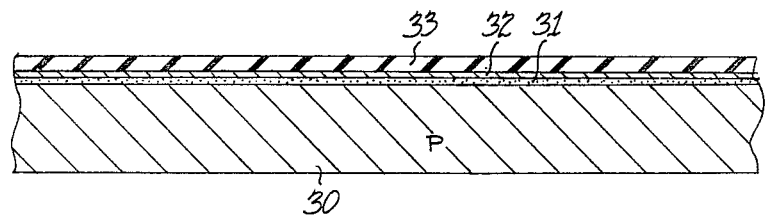
FIGS. 4a–4g are sectional views of the cell of FIG. 1 taken along the line a—a, at various stages in the manufacture thereof.

A method of making the cell of FIG. 1 will now be described with reference to FIGS. 4a-4g. The starting material is a slice of monocrystalline, semiconductor grade silicon which is about 3 inches in diameter and 50 mils thick; only a very small bar 30 of the silicon slice is shown in FIG. 4a, and this bar is greatly distorted in dimensions. The small area of the bar 30 which is seen in FIGS. 4a-4e contains one cell (or two adjacent cells in FIG. 1) and this area has a width of less than one mil. The area occupied by 16K or 16,384 cells plus sense amplifiers, decode circuitry, input/output buffers bonding pads, and the like, preferably would be less than 30,000 mils square. The area per cell in this case should be less than one mil square, preferably about one-half mil. In the actual scale, the various layers and regions in FIGS. 4a-4e would be very thin compared to the width dimensions.

Figure 4B:
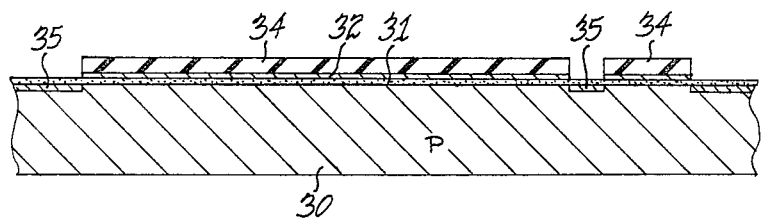
Figure 4C:
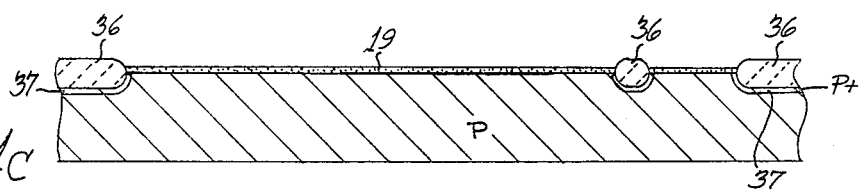
Figure 4D:
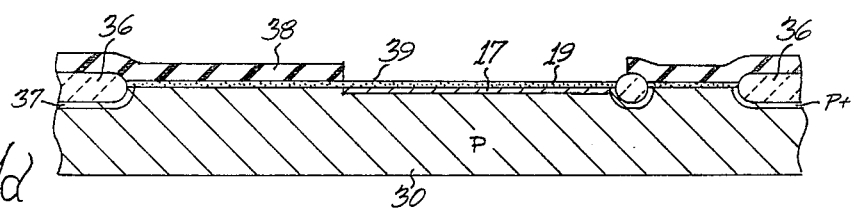
Figure 4E:
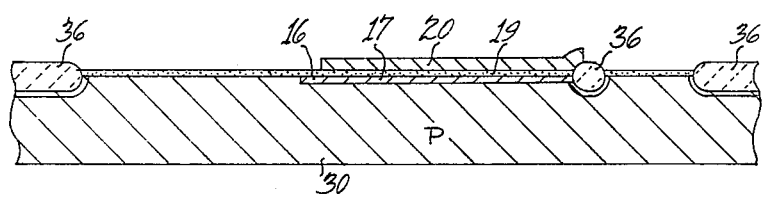
Figure 4F:
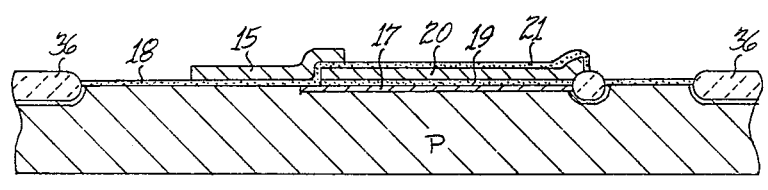
Figure 4G:
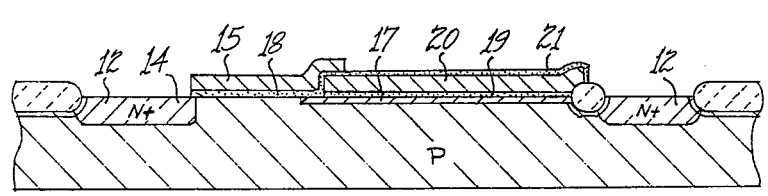

The silicon slice is first oxidized by placing in a furnace in an oxidizing atmosphere at about 1000° C. for a time sufficient to create a thin layer 31 of silicon oxide of about 1000 Å thickness. A layer 32 of silicon nitride $Si_3N_4$ is then applied over the oxide by exposing the slice to an atmosphere of silane and amonia in an rf plasma discharge. The nitride layer also has a thickness of about 1000 Å. A coating 33 of photoresist is applied over the nitride; typically the photoresist is KMER or Kodak Metal Etch Resist. The layer 33 is exposed to ultraviolet light through a mask which is prepared to define the desired pattern of the "moats" or field oxide areas as will appear. The photoresist 33 is developed, leaving areas 34 in place as seen in FIG. 4b. The slice is subjected to a selective etchant, such as a plasma etch technique, which will remove silicon nitride but will not attach the photoresist areas 34 or the silicon oxide layer 31. The slice is next subjected to an ion implant step, wherein boron atoms are implanted via a beam of about 100 Kev at a dosage of about $1 \times 10^{12}$ atoms per $cm^2$ to create a shallow P+ region 35 in the areas not masked by the photoresist islands 34 and the nitride 32. The slice is then subjected to a lengthy oxidation operation, several hours at 900° C. in steam, whereby thick field oxide regions 36 are created as seen in FIG. 4c. The nitride layer 32 masks the oxidation where it exists, but in the exposed areas the silicon surface is consumed to a depth of about 5000 Å, growing a layer 36 of about 10,000 Å. The original P+ region 35 is consumed, but boron is diffused ahead of the oxidation front to create P+ regions 37 beneath all of the field oxide regions 36. These regions 37 function as channel stops, preventing parasitic transistors from being created. The portions of the nitride layer 32 are next removed in a hot phosphoric acid etch, and the oxide 31 is removed in a hydrogen fluoride etch. The thin dielectric oxide layer 19 is thermally grown, at a thickness of about 500 Å over the entire exposed surface of the slice, without masking. Referring now to FIG. 4d the slice is coated with a photoresist layer 38, which is exposed to uV light through a mask which blocks the areas 39 above what are to be the implant regions 17. Next, phosphorous is implanted at about 150 Kev at a dosage of $1 \times 10^{12}$ per $cm^2$, using the developed photoresist as a mask, resulting in implanted regions 17 which are of the same form used for depletion load transistors. The remaining photoresist is then removed and polycrystalline silicon is deposited over the entire slice, using a process of decomposition of silane in a reactor, to a thickness of about 0.5 micron. This poly layer is subjected to a phosphorous diffusion to lower its resistance, then is patterned as seen in FIG. 4e using photoresist masking and etching to define first level polycrystalline silicon areas 20. The mask used in this operation is created to define the first level poly Vx line of FIG. 1. It is the left most side of the region 17, and not the left edge of the poly which defines the drain 16 of the MOS transistors of the storage cells of FIG. 3a. It is important that the area 16 of the implanted region 17 extends beyond the left edge of the poly layer 20. Referring to FIG. 4f, the gate oxide layer 18 is next created, either by stripping the exposed part of the layer 19 or by growing additional thermal oxide, to provide a gate oxide which is about 1000 Å in thickness, contrasted with the capacitor dielectric layer 19 which is only about one-half as thick. During growth of the additional thermal oxide, a coating 21 of oxide is formed over the exposed top surface of the poly layer 20. This thermal oxide need not be patterned and avoids mask alignment problems.

The next step is deposition of the second level poly 15. To this end, the entire slice is coated with polycrystalline silicon, perhaps about 10,000 Å in thickness, in a reactor as before. The slice is next coated again with photoresist and exposed through a mask which defines the pattern of the second level poly, i.e. the gates of the MOS transistors and the connections to the contact 23. The unwanted poly layer 15 is then etched, using the developed photoresist as a mask for an etchant which attacks silicon but not silicon oxide. Then, the slice is subjected to a short etch step to remove the remanents of the gate oxide layer 18 on exposed areas of the silicon surface, where diffused N+ regions are to be created.

The slice is now subjected to a phosphorus diffusion operation using conventional techniques, whereby N+ regions 12 and 14 are produced. The exposed polysilicon layer 15 is also heavily doped by this operation. The depth of this diffusion is about 8000 Å. The edge of the gate oxide 18 defines the edge of the channel of the MOS transistor. After the N+ diffusion, the entire slice is covered with a thick layer 22 of silicon oxide, using a low temperature deposition operation so that further diffusion of the impurities in regions 12, 14 and 37 does not occur. The thick oxide coating 22 is patterned, using photoresist, to create the openings for contact area 23, then a thin layer of aluminum is deposited on the entire slice and patterned using photoresist to leave the metal strip 13. This essentially completes the manufacturing process, although it is understood that the slices would be coated with a protective layer, scribed, broken into individual chips, and mounted in packages, according to conventional practice in the industry.

Due to the fact that the contact area 23 overlies the Vx line 20 or first level poly, the cell area is smaller than possible with single level poly cells. Reduction in cell size is also permitted because the capacitor areas can be underneath the contact area 23. Further, with the cell layout shown there is a lack of criticallity in the mask positioning for certain of the layers. It does not matter that the mask which defines the first level poly 20 would miss the edge of the moat which defines the capacitor 11, in either direction. The mask which defines the second level poly 15 can overlap the first level in the N+ moat area 14 without disaster. The positioning of the opening 23 is noncritical, as is that of the mask which defines the metal strip 13.

Figure 5:
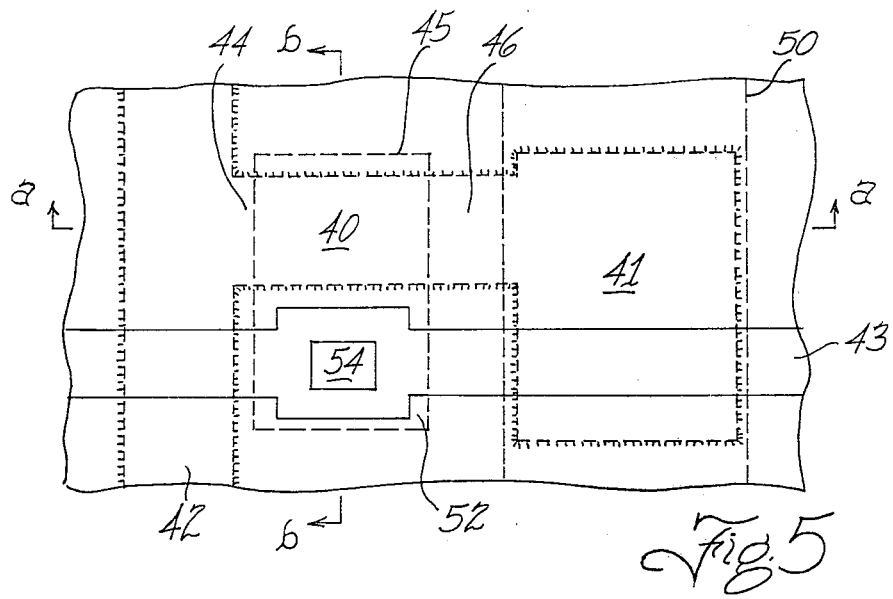
FIG. 5 is a plan view, greatly enlarged, of a small part of a semiconductor chip, showing a memory cell according to another embodiment of the invention.
Figure 6A:
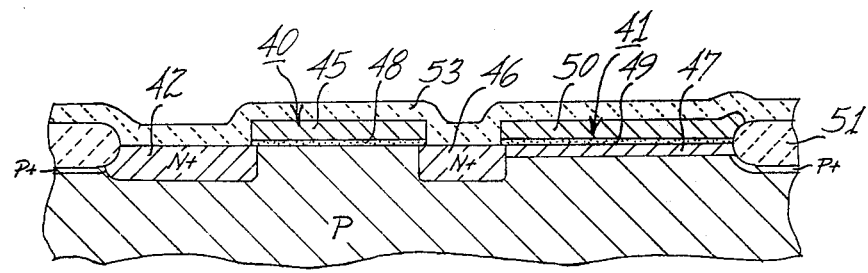
FIG. 6a and 6b are elevation views in section of the cell of FIG. 5, taken along the lines a—a and b—b in FIG. 5, respectively.
Figure 6B:
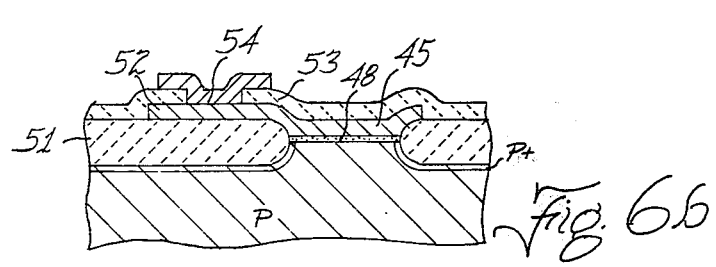
Figure 7:
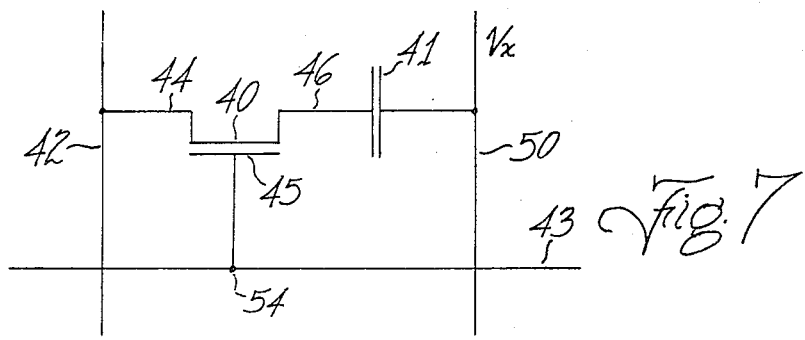
FIG. 7 is an electrical schematic diagram of the memory cell of FIG. 5.

Referring now to FIG. 5, an embodiment of the invention is shown using single level polysilicon in a RAM cell. The cell includes an MOS transistor 40, a storage-capacitor 41, a data line or bit line 42, and an address or word line 43, all of which are also seen in electrical schematic diagram in FIG. 7. The transistor has a source 44 which is part of the N+ diffused region forming the bit line 12, and a gate 45 which is an area of polycrystalline silicon. A drain region 46 is provided by an N+ diffused region between the gate 45 and the capacitor 41. According to the invention, an ion implanted region 47 provides the lower plate of the capacitor, as best seen in the sectional view of FIG. 6a. A silicon oxide layer 48 provides the gate insulator for the transistor 40, and an oxide layer 49 of the same thickness, formed at the same time as the layer 48, provides the capacitor dielectric. An elongated strip 50 of polysilicon forms the top plate of the capacitor 41 and is connected to a Vx supply voltage. As before, Vx is perhaps one-half Vdd, i.e. about 5 or 6 volts compared to ten to twelve for Vdd. The polysilicon layer which forms the gate 45 extends over the field oxide 51 to an area 52 where an opening in an overlying oxide coating 53 provides a contact 54 to the aluminum strip which provides the address line 43, as seen in FIG. 6b. The process for making the device of FIGS. 5–7 is the same as that of FIGS. 1-4 except that only a single level of polysilicon is employed. The ion implant step which creates the region 47 employs a photo resist mask as before; the implant is done after field oxide 51 is grown and before the polysilicon layer which forms the gate 45 and the Vx line 50 is deposited.

In a conventional one-transistor cell, the electrode corresponding to the line 50 must be connected to Vdd (usually +12 v) to create an inversion layer on the silicon surface that can accept a logic "1" storage voltage of up to one Vt below Vdd. In the cell of the invention, the storage capacitor is implanted with the appropriate type of dopant to exhibit depletion mode characteristics; for example, phosphorus for the N-channel process. Thus, a lower than Vdd voltage can be connected to the poly electrode of the storage capacitor to accept the same "1" level storage voltage. The pinch off voltage or implant dosage required for the MOS storage capacitor must be high enough so that at any selected Vx the channel will not be pinched-off at any storage voltage Vs. Vx is the voltage on the capacitor poly layer 50 or 20.

Figure 8A:
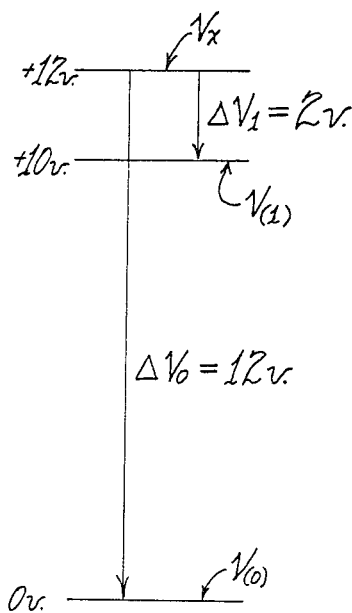
FIGS. 8a and 8b are graphic representations of voltages for various operating conditions for a prior art memory cell not a memory cell of the invention.
Figure 8B:
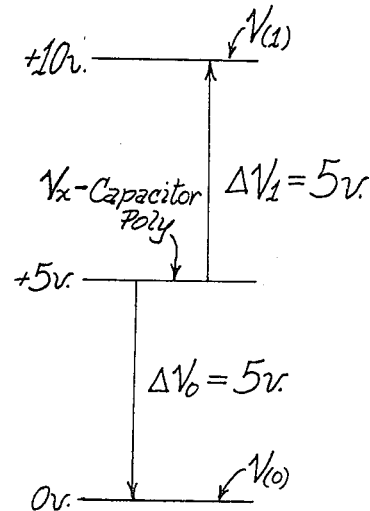

Reduction in electric field intensity in the storage capacitor thin oxide may be illustrated with example voltages. Assume that Vdd = +12 v, Vc = +5, a stored logic "1" or V(1) is +10 v and a stored logic "0" or V(0) is 0 v. In this case the maximum voltage across the storage capacitor oxide in a conventional cell is 12 v when "0" is stored. The maximum voltage for the cells of this invention is only 5 v when either a "1" or a "0" is stored, providing a 58% reduction in voltage or electric field intensity, as illustrated in FIGS. 8a and 8b. Here $\Delta V1$ is the voltage across the storage capacitor oxide when the stored data is a "1", and $\Delta V0$ when the stored data is a "0".

When a small cell size is most important, the field intensity reduction provided by the cell of the invention can be used to reduce the cell area because the oxide thickness can be reduced by 58% (for the example above) while maintaining the same field intensity. This means that the storage capacitance per unit area will be 58% higher or the storage capacitance area will be 58% smaller for the small storage capacitance and field intensity. In one example, this permitted the per cell area to be reduced from 0.725 square mil to 0.525 square mil.

In the example above, the Vx voltage was equal to Vcc for convenience. However, Vx can be set at any level from Vss or 0 v up to Vdd, as long as the depletion threshold is properly adjusted through ion implant to achieve the maximum charge storage capacity.

Figure 9:
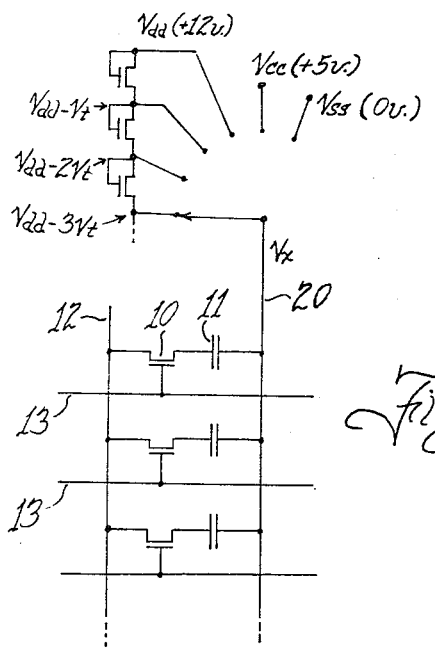
FIG. 9 is an electrical schematic diagram of an on-chip voltage supply for the cell of the invention.

In many dynamic RAM applications, it is desirable that Vcc supply be turned off during low power standby mode operation. To meet this requirement the Vx voltage can be generated from Vdd with an MOS circuit as seen in FIG. 9, implemented in the same chip as the memory array. The circuit may be programmed for various Vx voltages by a metal mask change to select one out of several possible voltages including Vdd, Vcc, Vss, and a Vx generated from Vdd. The Vx generated from Vdd has a further advantage in that high transient voltages on the supply lines as may occur accidentally are isolated from the capacitor dielectrics. A voltage spike can destroy a memory device by breaking down a capacitor dielectric.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An N-channel silicon gate random access memory cell having an insulated gate field effect transistor and a capacitor, said transistor having a source-to-drain path and a gate, comprising:
   (a) a body of P-type silicon having a major face;
   (b) an N+ type region defined in said major face and defining one end of said source-to-drain path of said transistor;
   (c) a capacitor region in said major face spaced from said N+ type region and defining a lower plate of said capacitor, said capacitor region being ion implanted with N-type conductivity determining impurity;
   (d) a thin oxide dielectric layer overlying said capacitor region;
   (e) a first layer of polycrystalline silicon overlying said dielectric layer and defining an upper plate of said capacitor;
   (f) an insulating coating over said first layer of polycrystalline silicon;
   (g) a transistor channel region in said major face between said N+ type region and said capacitor region, the channel region defining said source-to-drain path;
   (h) a thin gate oxide layer overlying said channel region, the thin gate oxide layer being substantially thicker than said thin oxide dielectric layer;
   (i) a second layer of polycrystalline silicon overlying said gate oxide layer to define said gate of said transistor and also partly overlying said first layer of polycrystalline silicon but insulated therefrom by said insulating coating;
   (j) an insulating layer overlying said second layer of polycrystalline silicon;
   (k) a conductive layer overlying said insulating layer and contacting said second layer of polycrystalline silicon through an aperture in said insulating layer at a contact area;
   (l) means for supplying logic signals to said N+ type region at at least two voltage levels, one of the levels being at a reference potential and the other being a positive voltage compared to the reference potential;
   (m) means for applying a bias voltage to said first layer of polycrystalline silicon, the bias voltage having a magnitude about half said positive voltage.

2. A memory cell according to claim 1 wherein said capacitor region extends beyond said first layer of polycrystalline silicon in the direction of said MOS transistor channel region.

3. A memory cell according to claim 2 wherein capacitor region is ion implanted with phosphorus.

4. A memory cell according to claim 2 wherein an apparent MOS transistor source or drain region is defined at one edge of said channel region by the ion implanted capacitor region.

5. In a memory cell of the type having a transistor at one face of a semiconductor body and a storage capacitor adjacent said transistor on said face for storing selected logic levels, said transistor having a gate insulator and said capacitor having a dielectric layer, said transistor having a channel region in series circuit with a semiconductor region of said capacitor, said capacitor having an upper plate above said semiconductor region, the improvement wherein said dielectric layer is significantly thinner than said gate insulator and said semiconductor region is ion-implanted to provide a threshold voltage substantially less than that exhibited by the transistor, and means are provided to apply a voltage of substantially less than the maximum of the logic levels to said upper plate.

6. In a memory cell according to claim 5, the channel region being contiguous with said one edge of the semiconductor region.

7. In a memory cell according to claim 5, a first conductive layer overlying a first thin oxide coating providing the gate of the transistor, and a second conductive layer overlying a second thin oxide coating providing the upper plate of the storage capacitor.

8. In a memory cell according to claim 7, the first and second conductive layers being polycrystalline silicon and one partially overlying the other.

9. In a memory cell according to claim 8 wherein the semiconductor region extends beyond the second conductive layer in the direction of the channel region.

10. In a memory cell according to claim 5, means for applying logic voltages to the storage capacitor through the channel region of the transistor, and means for applying a bias voltage to the capacitor, the bias voltage having a magnitude substantially less than the maximum magnitude of the logic voltages.

11. A memory cell of the type having a transistor at one face of a semiconductor body and a storage capacitor adjacent said transistor on said face for storing selected logic levels, said transistor having a channel region in series circuit with a semiconductor region of said capacitor, a first conductive layer overlying a first thin oxide coating providing the gate of said transistor, a second conductive layer overlying a second thin oxide coating providing an upper plate of said storage capacitor above the semiconductor region, the improvement wherein said semiconductor region is ion-implanted to provide a threshold voltage substantially less than that exhibited by said transistor, means to apply a voltage of substantially less than the maximum of the logic levels to said upper plate, said second thin oxide coating being substantially thinner than said first thin oxide coating.

12. A memory cell of the type formed at a face of a silicon body and having one insulated gate field effect transistor and a capacitor, the transistor including a conductive gate and including a source-to-drain path formed in said face, a gate insulator layer separating the conductive gate from the face, a heavily doped region as one end of the source-to-drain path in said face, the heavily doped region also forming an elongated sense line, the capacitor including a conductive plate which is separated from said face by a thin dielectric and including a capacitor region in said face beneath said plate, the capacitor region functioning as a plate of the capacitor, the thickness of the dielectric being substantially less than that of the gate insulator layer, the conductive plate being part of an elongated conductor strip which forms part of the capacitor of a number of like cells along said face, the conductor strip being connected to a selected potential, and elongated conductive means separate from the conductor strip connected to the gate and extending along the face, the source-to-drain path of the MOS transistor coupling the capacitor region to the sense line so that charge on the sense line may be stored in the capacitor and charge from the capacitor discharged into the sense line.

13. A memory cell according to claim 12 wherein first and second levels of polycrystalline silicon are included in the cell, with the second level at least partially overlying the first level but insulated therefrom, the first level providing said conductive plate and said elongated conductor strip, the second level providing the conductive gate of the transistor, the other end of the source-to-drain path of the transistor being provided by an edge of the capacitor region, the elongated conductive means being defined by the second level polycrystalline silicon.

14. A memory cell according to claim 13, wherein the capacitor region is an implanted region having a low threshold voltage.

15. A memory cell according to claim 13, wherein the capacitor region is an inverted region and the selected potential is a voltage of substantially less than logic levels stored in the capacitor in operation of the cell.

16. An MOS memory cell formed at a face of a silicon body said cell comprising an insulated gate field effect transistor and a capacitor, said transistor including a conductive gate and including a source-to-drain path formed in said face, a gate insulator layer separating said conductive gate from said face, a heavily doped region as one end of said source-to-drain path in said face, said heavily doped region also forming an elongated sense line, said capacitor storing logic levels of predetermined magnitude and including a conductive plate which is separated from said face by a thin dielectric, a lower plate of said capacitor beneath said dielectric engaging the other end of said source-to-drain path, said conductive plate being part of an elongated conductor strip which forms part of said capacitor for a number of like cells along said face, said strip being connected to a selected potential, and elongated conductive means separate from the conductor strip, said elongated conductive means being connected to said gate and extending along said face, said thin dielectric being substantially thinner than the thickness of said gate insulator, the source-to-drain path of the MOS transistor coupling the capacitor region to the sense line so that charge on the sense line may be stored in the capacitor and charge from said capacitor discharged into the sense line.

17. A memory cell according to claim 16 wherein first and second levels of polycrystalline silicon are included in the cell, with said second level at least partially overlying said first level but insulated therefrom, said first level providing said conductive plate and said elongated conductor strip, said second level providing the gate of said transistor, said capacitor including a capacitor region in said face forming said lower plate, the other end of the source-to-drain path of said transistor being provided by an edge of said capacitor region, said elongated conductive means being defined by said second level polycrystalline silicon.

18. A memory cell according to claim 17, wherein the capacitor region is an implanted region having a low threshold voltage.

* * * * *